United States Patent [19]

Miyazawa

[11] Patent Number: 4,949,087
[45] Date of Patent: Aug. 14, 1990

[54] ENCODER DEVICE

[75] Inventor: Azuma Miyazawa, Mitaka, Japan

[73] Assignee: Olympus Optical Co., Ltd., Japan

[21] Appl. No.: 304,800

[22] Filed: Jan. 31, 1989

[30] Foreign Application Priority Data

Feb. 5, 1988 [JP] Japan .................................. 63-026461

[51] Int. Cl.⁵ .......................................... H03M 1/22
[52] U.S. Cl. ........................................ 341/16; 341/1;
354/289.11; 354/289.12
[58] Field of Search ....................... 341/7, 15, 16, 116,
341/126, 155, 158; 354/289.1, 289.11, 289.12,
402, 403, 409; 352/140; 250/231 SE

[56] References Cited

U.S. PATENT DOCUMENTS 3,553,683  1/1971  Simoneau et al. ..................... 341/16
4,560,267  12/1985  Nakai et al. .......................... 354/412

FOREIGN PATENT DOCUMENTS 61-22534  2/1986  Japan .

Primary Examiner—William M. Shoop, Jr.
Assistant Examiner—Brian K. Young
Attorney, Agent, or Firm—Louis Weinstein

[57] ABSTRACT

An encoder device comprises a first resistor having one end connected to a first contact piece and the other end connected to an A/D conversion input terminal, a second resistor having one end connected to a second contact piece and the other end connected to the other end of the first resistor and having a different resistance value from that of the latter, a first pattern electrode to which a first potential is applied, a second pattern electrode to which a second potential is applied, and a non-electrode zone on which neither of said first and second pattern electrodes is provided. With such arrangement, when first and second contact pieces slidingly move while in contact with one of said first and second pattern electrodes as well as a non-electrode zone, a voltage is produced at the A/D conversion input terminal which voltage is variable in accordance with combinations of sliding contacts between the set of the first and second contact pieces and the set of the first and second pattern electrodes as well as a non-electrode zone.

34 Claims, 5 Drawing Sheets

| A/D VALUE | 0 | | 1 | 2 | | 3 | | 3 |
|---|---|---|---|---|---|---|---|---|
| A | L | L | OFF | H | L | OFF | H | H | OFF |
| B | L | OFF | L | L | H | H | OFF | H | OFF |

ENCODER DEVICE

BACKGROUND OF THE INVENTION

The present invention relates to an encoder device for converting movement such as rotation into an A/D conversion signal, and more particularly, to an encoder device for use with a zoom lens barrel or the like of a camera.

An encoder device for use with a zoom lens barrel or the like has been proposed in Japanese Laid-Open Patent Application Sho No. 62-180338, for example. Such an encoder device reads out a resistance division A/D conversion encoder which performs A/D conversion of an output from a resistance printed pattern or a digital pattern.

With the digital encoder described above, however, a number of ports are required when used in a CPU. In addition, with the resistance division A/D conversion encoder, variations in power voltage and printed resistance should be taken into consideration, resulting in difficulty in obtaining a stable encoder value.

SUMMARY OF THE INVENTION

It is an object of the present invention to provide an encoder device having a comparatively small number of ports and being capable of obtaining a comparatively stable output even with variations in voltage and resistor value.

The present invention has the following advantages. (1) It is possible to produce a stable encoder value at an A/D conversion input terminal. (2) It is possible to produce twice the amount of information as that obtained from a conventional digital encoder at one of the A/D conversion input terminals. (3) There is no influence upon the result of an A/D conversion even with slight variations in resistance and applied voltage. (4) It is possible to employ a higher bit resulted from an A/D conversion as it is as an encoder value.

DETAILED DESCRIPTION OF PREFERRED EMBODIMENTS

Figures 1A, 1B:
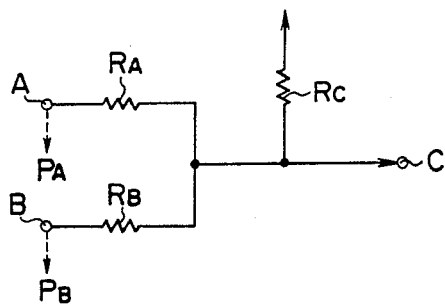
FIGS. 1A and 1B respectively shown an electric circuit diagram and a table for an encoder pattern for explaining outlines of an embodiment of an encoder device according to the present invention.

Prior to the detailed description of an embodiment of the present invention, a structure and operation of a basic encoder device according to the invention will be described hereinafter. In the basic encoder device, as shown in FIG. 1A, one end of a first resistor $R_A$ is connected to a first contact piece A and the other end thereof is connected to an A/D conversion input terminal C for a CPU and the like. One end of a second resistor $R_B$ whose value is different from that of the first resistor $R_A$ is connected to a second contact piece B and the other end thereof is connected to the other end of the first resistor $R_A$.

The contact pieces A and B are in sliding contact with respective patterns $P_A$ and $P_B$ in rows formed on the outer periphery of a zoom ring, for example, of a camera. Each row of the patterns $P_A$ and $P_B$ comprises a first pattern electrode to which a first potential at a level "H" such as a reference potential Vref is applied, a second pattern electrode to which a second potential at a level "L" such as the ground potential GND is applied and a non-electrode zone in which neither of the first and second pattern electrodes is provided (the OFF condition in neither case of the "H" and "L" levels).

With such arrangement, when first and second contact pieces A and B slidingly move while in contact with one of the first and second pattern electrodes as well as a non-electrode zone, combinations of contact between contact pieces A, B and first and second pattern electrodes as well as non-electrode zone produce combinations of levels at the contact pieces A, B as shown in FIG. 1B. Thus, four different A/D values can be obtained at the A/D conversion input terminal C. By way of example, as shown in FIG. 1B, the A/D value is "0" when one of first and second contact pieces A, B is at the level "L" and the other thereof is at the level "L" or OFF, the A/D value is "1" when the first contact piece A is at the level "H" and the second contact piece is at the level "L", the A/D value is "2" when the first contact piece A is at the level "L" and the second contact piece B is at the level "H" and the A/D value is 3 when one of first and second contact pieces A, B is at the level "H" and the other thereof is at the level "H" or OFF.

As such, four different A/D values are inputted into the single A/D conversion input terminal C by combining pattern conductors $P_A$, $P_B$ in two rows with two resistors $R_A$, $R_B$.

A pull-up resistor $R_C$ connected to the other ends of first and second resistors $R_A$, $R_B$ is connected to a point for applying a third potential (not shown) at the level "H" and has a high resistance for preventing malfunctions as to be effective in use when the patterns $P_A$ and $P_B$ which are in contact with respective contact pieces A, B are narrow in distance therebetween. However, the resistor $R_C$ may be basically dispensed with. With the resistor $R_C$ connected, an A/D value is "3" when both of the first and second contact pieces A, B are "OFF". Consequently, even when first and second contact pieces A, B are both in a condition that they are floating, there is the effect of preventing the occurrence of error signals.

The above description shows an example of two contact pieces which are respectively provided with resistors. It will be understood that three or more contact pieces provided with respective resistors may be employed. In this case, since the number of potentials at the junction of each of resistors is $2^n$ (n is the number of contact pieces), it needs the resolving powers of the A/D converter of $2^n$. In addition, while the number of potentials on the pattern conductor is two in the above description, it will be noted that three or more potentials may be employed.

An embodiment of the present invention will be described hereinafter in detail.

Figure 2:
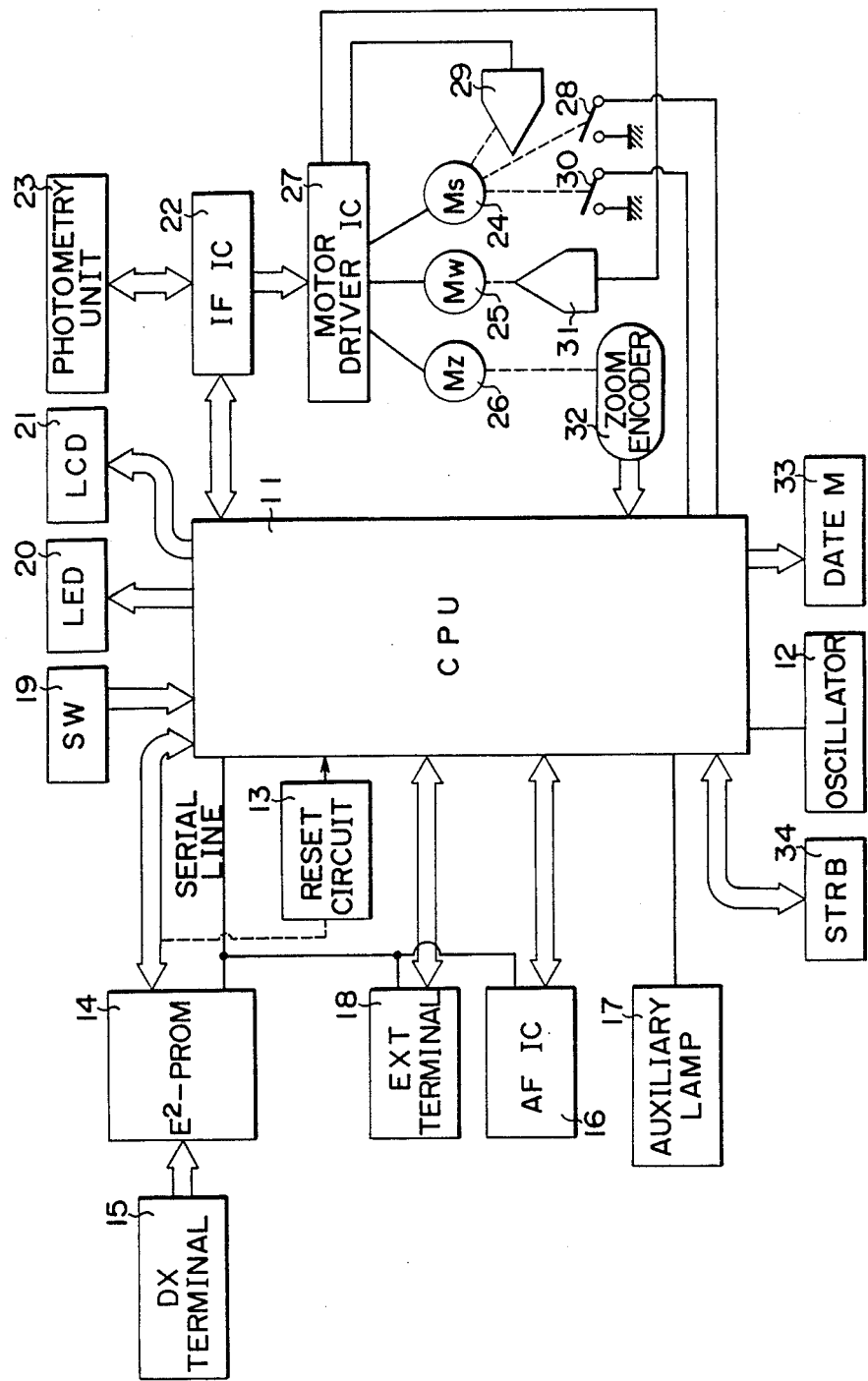
FIG. 2 is a block diagram illustrating a basic system of a zoom lens camera to which the present invention is applied.

The basic system of a zoom lens camera to which the present invention is applied will be described with reference to FIG. 2. A CPU 11 is constituted by one chip microcomputer which controls all operations of a camera. Basic clock pulses from an oscillator circuit 12 are inputted into CPU 11 which starts its operation by a reset signal from a reset circuit 13. The reset circuit 13 operates when a battery is charged and a power switch (not shown) turns on.

$E^2$-PROM 14 is a non-volatile memory which stores camera conditions (the number of film frames, while winding, etc) and adjustment data (shutter control, lens drive, etc). Consequently, even when the battery is removed, a camera can retain its previous conditions. In addition, $E^2$-PROM 14, as described later, stores a difference in movement of a lens which may be caused by variations in each lens. The reset operation of the reset circuit 13 is inhibited while data are written in $E^2$-PROM 14. When $E^2$-PROM 14 is brought into a write mode, a DX code of a film is first inputted from a DX terminal 15 into $E^2$-PROM 14 and subsequently is inputted through a serial line into CPU 11. Thereafter, the data in the $E^2$-PROM 14 are inputted into CPU 11.

An IC 16 for auto focusing (AF) is an AF sensor of the phase difference type which is provided at a range measuring position by a non-TTL method and the resulting range data are fed to CPU 11. CPU 11 lights an auxiliary lamp 17 simultaneously with operation of the IC 16. A terminal EXT 18 is a terminal to connect exterior apparatus such as an option automatic adjusting device. In order to effectively utilize ports of CPU 11, $E^2$-PROM 14, IC 16 and EXT terminal 18 are connected to the same serial line so as to interchange data with CPU 11 by serial communication.

SW 19 is an operation switch for a camera and includes a release switch, mode change-over switch and the like. LED 20 is a light emitting diode disposed within a view finder and includes light emitting diodes for giving advance notice of lighting an electronic flash unit, displaying an in-focus condition and the like. LCD 21 is a liquid crystal display board for displaying the number of film frames, a camera mode and the like. IC 22 for IF is an interface IC for effecting a photometric operation with a photometric unit 23 and decoding to select a motor within the camera by instruction of CPU 11.

$M_S$ 24, $M_W$ 25 and $M_Z$ 26 are respectively a shutter motor, winding/rewinding motor and zoom motor and are driven by a decode signal of IC 22 through a motor driver IC 27.

$M_S$ 24 contacts a lens drive during normal rotation and a shutter drive during the reverse rotation. During the lens drive, a reset position of a lens is confirmed by closure (ON) of switch 28 and a control position is confirmed by the number of pulses of photointerrupter 29. During the shutter drive, the reset position is confirmed by closure (ON) of switch 30 and an exposure aperture is controlled by adjusting a pulse width of $M_S$ 24. The adjusted value is stored in $E^2$-PROM 14.

$M_W$ winds a film during normal rotation and rewinds during the reverse rotation. The feed control of one film frame is effected by counting the number of pulses of photointerrupter 31. Photointerrupters 29, 31 turn ON only when $M_S$ 24 and $M_W$ 25 are selected respectively and outputs thereof are fed through IC 22 to CPU 11. A zoom position of $M_Z$ 26 can be detected by a zoom encoder 32.

DATEM 33 is a date module for entering data such as a date and time into a film and STR B 34 is an electronic flash unit.

Figure 3:
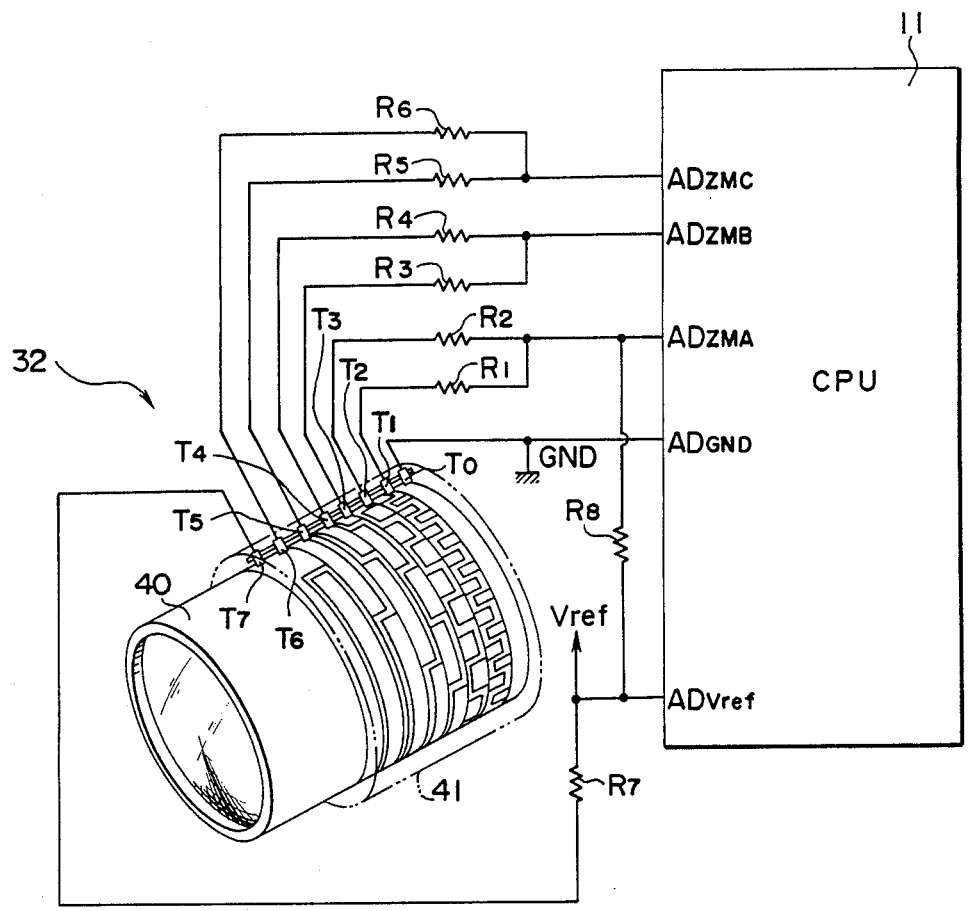
FIG. 3 is an electric circuit diagram illustrating the arrangement of a zoom encoder shown in FIG. 2.

A zoom encoder 32 will be described hereinafter in detail. Referring to FIG. 3, the zoom encoder 32 is constructed of a thin film pattern conductor provided in a unitary manner by adhesion or the like on the outer periphery of a zoom ring 40, conductive contact pieces and a group of resistors which are in sliding contact with the pattern conductor. When $M_Z$ 26 (FIG. 2) rotates, the zoom ring 40 rotates and a zoom lens moves back and forth by means of a cam (not shown) within the zoom ring to change the focal length thereof. The focal length is obtained by detecting a position where the pattern conductor of zoom encoder 32 on the zoom ring 40 moves.

Eight contact pieces $T_0$ to $T_7$ for detecting a moving position of the pattern conductor are fixed to a stationary frame 41 and are respectively connected to a ground terminal $AD_{GND}$ of CPU 11 and one end of resistors $R_1$, $R_2$, $R_3$, $R_4$, $R_5$, $R_6$ and $R_7$. Values of these resistors are set so as to be $(R_1/R_2)=(R_3/R_4)=(R_5/R_6)=1.67$. The other ends of resistors $R_1$ and $R_2$ are connected to each other and to an A/D conversion terminal $AD_{ZMA}$ of CPU 11. The other ends of resistors $R_3$ and $R_4$ are also connected to each other and to an A/D conversion terminal $AD_{ZMB}$ of CPU 11. The other ends of resistors $R_5$ and $R_6$ are similarly connected to each other and to an A/D conversion terminal $AD_{ZMC}$. The other end of the protection resistor $R_7$ is connected to a terminal $AD_{Vref}$ to which a reference voltage Vref of CPU 11 is applied. Resistor $R_7$ is a protecting resistor in the event that the reference voltage Vref is short-circuited to the ground terminal GND. The junction point between resistors $R_1$ and $R_2$ is connected through a resistor $R_8$ to a reference voltage Vref terminal, where the reference voltage Vref coresponds to a third voltage which is described with reference to FIG. 1.

Figures 4A, 4B:
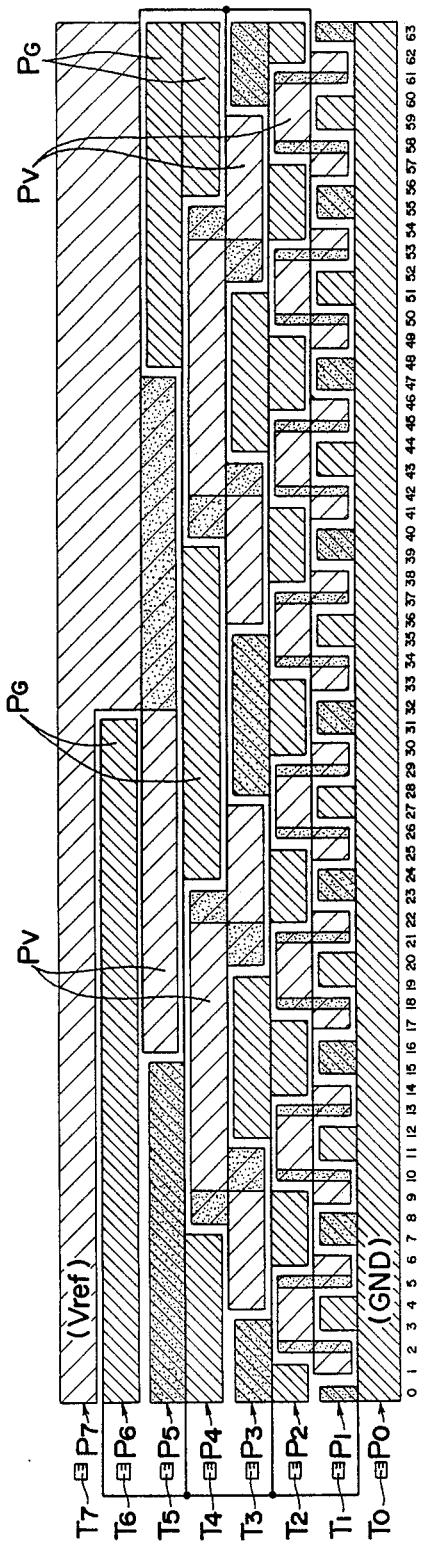
FIG. 4A is a developed diagram of an encoder pattern on the zoom ring shown in FIG. 3
FIG. 4B is a tabular chart of codes to encoder positions of the encoder pattern.

The conductor pattern of zoom encoder 32 in development is shown in FIG. 4A. The conductive patterns $P_0$ and $P_7$ with which the contact pieces $T_0$ and $T_7$ located on the opposite ends of the eight contact pieces $T_0$ to $T_7$ are respectively in sliding contact, are formed of conductors which are continuous over the entire zoom zone along the peripheral direction of zoom ring 40 and, to which the ground potential GND and reference voltage Vref are respectively applied. The pattern conductors $P_1$ to $P_6$ with which the intermediate contact pieces $T_1$ to $T_6$ between $T_0$ and $T_7$ are respectively in sliding contact, are formed of conductors shaped in configurations which are discontinuous in the peripheral direction of zoom ring 40, as shown in FIG. 4A. Each of the pattern conductors $P_1$ to $P_6$ electrically includes a pattern electrode $P_G$ (the shadowed portion by close oblique lines rising to the right) which is partially connected to the pattern conductor $P_0$ to which the ground potential GND is applied, a pattern electrode $P_V$ (the shadowed portion by rough oblique lines falling to the right) which is connected to the pattern conductor $P_7$ to which the reference voltage Vref is applied, and a non-electrode zone in which neither of the pattern electrodes $P_G$ and $P_V$ exist. The width of the non-electrode zone in its circumferential direction is smaller than that of contact pieces $T_1$ to $T_6$. The non-electrode zone has an area larger than the contact areas between the pattern conductors $P_1$ to $P_6$ and contact pieces $T_1$ to $T_6$. Consequently, when the contact pieces $T_1$ to $T_6$ slidingly move on the pattern conductors $P_1$ to $P_6$ of zoom encoder 32 with rotation of the zoom ring 40, the contact pieces $T_1$ to $T_6$ detect code signals of a set of 64 kinds from the initial point "0" to the end point "63" of zoom encoder positions in response to rotational positions of the zoom ring 40, depending upon configurations of the conductor patterns $P_1$ to $P_6$. In FIG. 4A, portions dotted on the pattern electrodes $P_G$ and $P_V$ are auxiliary pattern conductors for preventing malfunction, so that they may basically be non-electrode zones by removing the pattern electrodes provided on the portions.

Code signals of a set of 64 combinations of the pattern conductors $P_1$ to $P_6$ which are picked up by the contact pieces $T_1$ to $T_6$ are shown in FIG. 4B. In the case signal table, the contact pieces $T_1$ to $T_6$ assume "1" when the reference voltage Vref is applied and assume "0" when the ground potential GND is applied.

Now, noting only the pattern conductors $P_1$ and $P_2$, since four conditions (0, 0), (0, 1), (1, 1) and (1, 0) are determined by reading these two pattern conductors with the contact pieces $T_1$ and $T_2$, four levels, as shown in the following table, are determined at the A/D conversion terminal $AD_{ZMA}$ of CPU 11 by means of the resistors $R_1$ and $R_2$.

TABLE

| $P_2$ | $P_1$ | Ideal A/D value (Vref = 1) | Tolerance for variation (A/D error 0.02) |
|---|---|---|---|
| Either one is H (true also even when the other one is OFF | | 1 | 0.77~1 |
| H | L | $\frac{R_1}{R_1 + R_2} = 0.625$ | 0.52~0.72 |
| L | H | $\frac{R_2}{R_1 + R_2} = 0.375$ | 0.27~0.47 |
| Either one is L (true also even when the other one is OFF) | | 0 | 0~0.22 |

Specifically, since $R_1:R_2=1.67$ when the reference voltage Vref is 1, inputs to the A/D conversion terminal $AD_{ZMA}$ based on the combined resistance of resistors $R_1$ and $R_2$, are divided into four levels of 0~0.22, 0.27~0.47, 0.52~0.72 and 0.77~1, as shown in Table. Since the terminal $AD_{ZMA}$ of CPU 11 has a high impedance, when either one of the pattern conductors $P_1$ and $P_2$ is OFF, it assumes the level of the other one. The two other A/D conversion terminals $AD_{ZMB}$ and $AD_{ZMC}$ of CPU 11 have the same structure as the above.

Since the zoom encoder 32 has pattern conductors in six rows, it is possible to detect encoder positions of sixty four ("0" to "63") in all with moving pattern conductors. Encoder positions "1", "60" and "63" are respectively set to the wide-end, tele-end and macro positions. Encoder positions "61" and "62" are in the intermediate zone where a picture is not taken and encoder position "0" is outside the wide position.

When inputs to the terminals $AD_{ZMA}$, $AD_{ZMB}$, and $AD_{ZMC}$ are divided into four levels, as described above, subsequent disposition can be greatly simplified. Specifically, a result of each A/D conversion is data of 8 bits in all with 8 bit A/D converter, for example. Of these data, however, the two higher bits have been already divided into four levels in correspondence with "00", "01", "10" and "11" (binary digit), so that there is no need to newly divide A/D conversion inputs in level. In addition, since a scope of variation is very large, it is possible to constantly obtain stable results even when there are variations in resistance and the reference voltage Vref.

Furthermore, as shown in FIG. 3, the other ends of resistors $R_1$ and $R_2$, which are connected to each other and to the A/D conversion terminal $AD_{ZMA}$, are connected through a resistor $R_8$ of high resistance to the reference voltage Vref, so that the condition can be determined to be "11" (binary digit) even when both contact pieces $T_1$ and $T_2$ are in contact with the non-electrode zone (OFF). Such arrangement is serviceable for prevention of malfunctions when the distance between two pattern conductors $P_1$ and $P_2$ is narrow and simplifies the structure of the pattern electrode.

Figure 5:
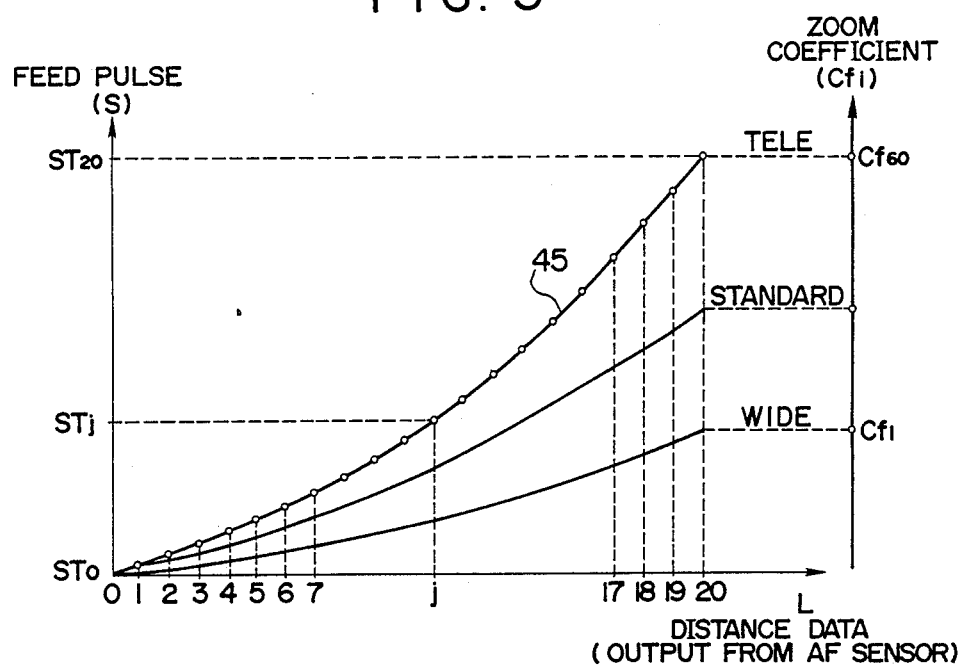
FIG. 5 is a diagram illustrating an amount of moving out of a lens to an AF sensor output.

The calculation of movement of a lens for autofocusing will be described hereinafter. Range data 1/l are given by the IC 16 for AF as data of six bit integers and six bit decimals. Since this camera is the inner focus type, a lens movement S (the number of pulses for lens movement) varies according to a zoom position (focal length) even with the same range, as shown in FIG. 5. Specifically, in FIG. 5, which illustrates typical curves on the tele, standard and wide conditions, a lens moves out along sixty different lens movement curves from the wide-end position "1" to the tele-end position "60". However, since CPU 11 does not have sufficient capacity for storing all the curves, CPU 11 stores lens movements S at twenty integer points of 0 to 20 on the tele curve 45 in the range data 1/l, in ROM. Let $ST_j$ (j=0 to 20) denote these data of lens movements S on the tele condition. Focal length curves other than the tele curve, which are on lines internally divided in a certain ratio at every range data 1/l with respect to the tele curve 45, can be approximately determined by multiplying a certain zoom factor to the tele curve 45. Consequently, zoom factors $Cf_i$ (i=1 to 60) corresponding to sixty curves, where $Cf_i$ denotes a zoom factor for each focal length, are stored in ROM of CPU 11.

Assuming that data in IC 16 for AF have an integer part a and a decimal part b, a lens movement S (the number of lens movement pulses) at a zoom encoder value i can be determined by the following simple equation.

$$S = \{b(ST_{a+1} - ST_a) + ST_a\} \cdot Cf_i \qquad (1)$$

With the equation in the form as shown above, the calculation can be sufficiently performed even with a four bit microcomputer which has a small number of operational instructions. However, since curves in the macro condition are totally different from those shown in FIG. 5, the macro curves are separately stored in CPU 11. A calculation formula for the macro curves is the same as the equation (1) only with omission of the zoom factor $Cf_i$.

Figure 6:
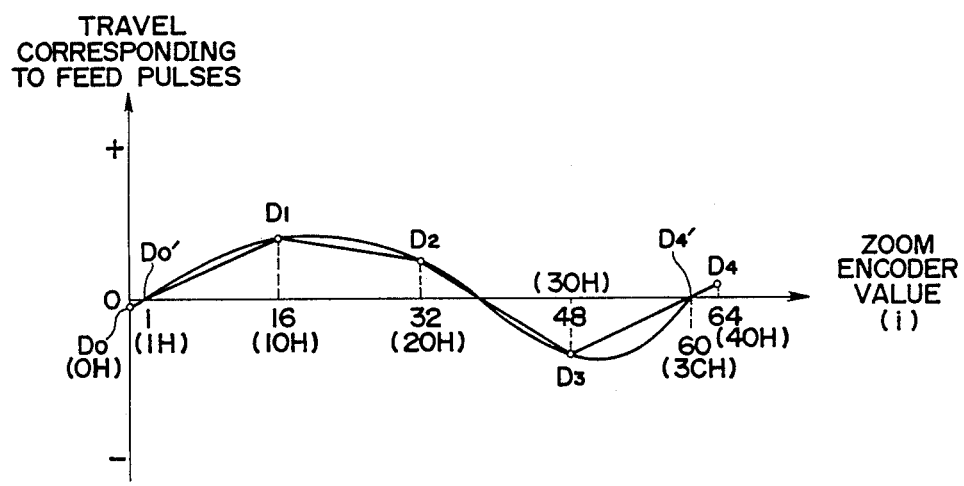
FIG. 6 is a diagram illustrating supplementary movement for an amount of moving out a lens to a zoom encoder position.

The above is applicable only when a zoom lens is made exactly on design. However, there are practical variations in each actual lens, resulting in the curves shown in FIG. 5 are shifted upward and downward in parallel by an amount of variation. The parallel shifting, of course, varies according to each lens. Even if adjustment is made so as to be zero in differences at the tele- and wide-end positions, however, differences at zoom positions between the tele- and wide-end positions are not zero, which is as shown in FIG. 6, for example. As shown in FIG. 6, differences at the wide-end position "1" and the tele-end position "60" are zero because the adjustment has been made.

Now, the camera stores the difference data in $E^2$-PROM 14 as five data $D_k$ (k=0 to 4). The five data are stored respectively as zoom encoder values $D_0$, $D_1$, $D_2$, $D_3$ and $D_4$ which all have the at least lower four-bits "0000" of zoom encoder values and whose values are 0 (0 H in hexadecimal), 16 (10 H, ditto), 32 (20 H, ditto), 48 (30 H, ditto) and 64 (40 H, ditto). However, since the zoom encoder positions "0" and "64" cannot be measured, during the actual measurement, the number of lens difference pulses at each of the points 1 (1 H), 16 (10 H), 32 (30 H), 48 (30 H) and 60 (3 CH) are determined. Of these numbers, measured data $D_0'$ at the wide-end position "1" and $D_4'$ at the tele-end position "60" on the zoom encoder are employed to obtain data $D_0$ and $D_4$ at the zoom encoder positions "0" and "64". Specifically, data $D_0$ and $D_4$ are determined by the following equations (2) and (3).

$$D_0 = D_0' - (D_1 - D_0')/15 \tag{2}$$

$$D_4 = D_3' + (D_4' - D_3')/12 \tag{3}$$

Then, a pulse movement $Z_S$ at the zoom encoder value i is determined by the following equation.

$$Z_S = D_{ia}' + (D_{(ia+1)} - D_{ia}') \cdot ib \tag{4}$$

where ia is a higher two-bit integer and ib is a lower four-bit decimal when the zoom encoder value i is denoted by a binary digit. The value $Z_S$ of the equation (4) also can be sufficiently calculated with a four-bit microcomputer.

As a result of the calculation, an actual movement is as follows.

$$S + Z_S$$

As is made clear from the equations (2) and (3), even when results of the adjustment at the tele- and wide-positions are not zero, it is possible to compensate the value by storing it in $E^2$-PROM 14.

What is claimed is:

1. An encoder device comprising:
pattern conductor means and first and second contact pieces being movable relative to one another;
said pattern conductor means including first pattern electrodes to which a first potential is applied and second pattern electrodes to which a second potential is applied, first and second arrays each having a selected number of said first and second pattern electrodes, the arrangement of said first and second pattern electrodes in said first and second arrays being different;
said first and second conductive contact pieces being in sliding contact with one of said first and second arrays;
input means comprising a first resistor which has one end connected to said first conductive contact piece and the other end connected to an A/D conversion input terminal and a second resistor which has one end connected to said second conductive contact piece and the other end connected to the other end of said first resistor and which has a different resistance from that of said first resistor, for inputting a voltage to said A/D conversion input terminal which voltage is variable in response to a change in sliding contact position of said first and second conductive contact pieces with reference to said pattern conductor, said first and second arrays being arranged to enable said input means to apply a voltage to said A/D conversion input terminal which is capable of assuming a plurality of voltage levels which are greater in number than the two potentials each respectively applied to one of said first and second arrays, the voltage level applied to the A/D conversion input terminal being determined by the position of said first and second conductive contact pieces relative to said first and second arrays.

2. An encoder device comprising:
pattern conductor means and first and second contact pieces being movable relative to one another;
said pattern conductor means including a first pattern electrode to which a first potential is applied and a second pattern electrode to which a second potential is applied;
said first and second conductive contact pieces being in sliding contact with one of said first and second pattern electrodes; and
input means comprising a first resistor which has one end connected to said first conductive contact piece and the other end connected to an A/D conversion input terminal and a second resistor which has one end connected to said second conductive contact piece and the other end connected to the other end of said first resistor and which has a different resistance from that of said first resistor, for inputting a voltage to said A/D conversion input terminal which voltage is variable in response to a change in sliding contact position of said first and second conductive contact pieces with reference to said pattern conductor;
said first potential being a potential at a level "H" such as a reference voltage Vref and said second potential being a potential at a level "L" such as the ground potential.

3. An encoder device comprising:
pattern conductor means and first and second contact pieces being movable relative to one another;
said pattern conductor means including a first pattern electrode to which a first potential is applied and a second pattern electrode to which a second potential is applied;
said first and second conductive contact pieces being in sliding contact with one of said first and second pattern electrodes; and
input means comprising a first resistor which has one end connected to said first conductive contact piece and the other end connected to an A/D conversion input terminal and a second resistor which has one end connected to said second conductive contact piece and the other end connected to the other end of said first resistor and which has a different resistance from that of said first resistor, for inputting a voltage to said A/D conversion input terminal which voltage is variable in response to a change in sliding contact position of said first and second conductive contact pieces with reference to said pattern conductor;
the ratio $R_A/R_B$ in resistance between said first and second resistors $R_A$ and $R_B$ being set so as to be substantially equal to 1.67 where $R_A$ and $R_B$ denote respective resistances thereof.

4. An encoder device comprising:

pattern conductor means and first and second contact pieces being movable relative to one another;

said pattern conductor means including a first pattern electrode to which a first potential is applied and a second pattern electrode to which a second potential is applied;

said first and second conductive contact pieces being in sliding contact with one of said first and second pattern electrodes; and input means comprising a first resistor which has one end connected to said first conductive contact piece and the other end connected to an A/D conversion input terminal and a second resistor which has one end connected to said second conductive contact piece and the other end connected to the other end of said first resistor and which has a different resistance from that of said first resistor, for inputting a voltage to said A/D conversion input terminal which voltage is variable in response to a change in sliding contact position of said first and second conductive contact pieces with reference to said pattern conductor;

said pattern conductor being provided on the peripheral surface of a zoom ring which is rotatably disposed on a lens barrel of a camera so as to move a zoom lens within the lens barrel back and forth in an axial direction with rotation of the lens barrel to change a focal length of the zoom lens, such that each of said conductive contact pieces fixed to a stationary frame is in sliding contact with said pattern conductor.

5. An encoder device comprising:

pattern conductor means and first and second contact pieces being movable relative to one another;

said pattern conductor means including a first pattern electrode to which a first potential is applied and a second pattern electrode to which a second potential is applied;

said first and second contact pieces being in sliding contact with one of said first and second pattern electrodes; and input means comprising a first resistor which has one end connected to said first conductive contact piece and the other end connected to an A/D conversion input terminal and a second resistor which has one end connected to said second conductive contact piece and the other end connected to the other end of said first resistor and which has a different resistance from that of said first resistor, for inputting a voltage to said A/D conversion input terminal which voltage is variable in response to a change in sliding contact position of said first and second conductive contact pieces with reference to said pattern conductor;

said pattern conductor being provided on the peripheral surface of a zoom ring which is rotatably disposed on a lens barrel of a camera so as to move a zoom lens within the lens barrel back and forth in an axial direction with rotation of the lens barrel to change a focal length of the zoom lens, such that each of said conductive contact pieces fixed to a stationary frame is in sliding contact with said pattern conductor;

said zoom ring being rotatable by means of a zoom motor and said pattern conductor being in the form of plural belt rows in the peripheral direction of the zoom ring, such that the conductive contact pieces are in sliding contact with an associated pattern belt row.

6. An encoder device comprising:

pattern conductor means and first and second contact pieces being movable relative to one another;

said pattern conductor means including a first pattern electrode to which a first potential is applied and a second pattern electrode to which a second potential is applied;

said first and second conductive contact pieces being in sliding contact with one of said first and second pattern electrodes; and input means comprising a first resistor which has one end connected to said first conductive contact piece and the other end connected to an A/D conversion input terminal and a second resistor which has one end connected to said second conductive contact piece and the other end connected to the other end of said first resistor and which has a differnt resistance from that of said first resistor, for inputting a voltage to said A/D conversion input terminal which voltage is variable in response to a change in sliding contact position of said first and second conductive contact pieces with reference to said pattern conductor;

said pattern conductor being provided on the peripheral surface of a zoom ring which is rotatably disposed on a lens barrel of a camera so as to move a zoom lens within the lens barrel back and forth in an axial direction with rotation of the lens barrel to change a focal length of the zoom lens, such that each of said conductive contact pieces fixed to a stationary frame is in sliding contact with said pattern conductor;

said zoom ring being rotatable by means of a zoom motor and said pattern conductor is in the form of plural belt rows in the peripheral direction of the zoom ring, such that the conductive contact pieces are in sliding contact with an associated row of the pattern belts;

said pattern conductor being in the form of plural belt rows and comprising two pattern rows on the opposite sides thereof which are formed of a conductor continuous over the whole zoom zone along the peripheral, direction of the zoom ring and which are respectively maintained at ground potential GND and reference potential Vref and six intermediate pattern rows between the opposite side rows which are in a discontinuous shape in the peripheral direction such that each of said intermediate pattern rows includes a first pattern electrode connected to a pattern zone to which said ground potential GND is partially applied, a second pattern electrode connected to another pattern zone to which said reference voltage Vref is partially applied and a non-electrode zone in which neither of first and second pattern electrodes is provided.

7. An encoder device according to claim 1 in which a non-electrode zone which is non-conductive is provided between said first and second pattern electrodes in each array and a pull-up resistor is further connected between the junction point between said first and second resistors and a third potential terminal.

8. An encoder device comprising:

pattern conductor means and first and second contact pieces being movable relative to one another;

said pattern conductor means including a first pattern electrode to which a first potential is applied and a second pattern electrode to which a second potential is applied;

said first and second conductive contact pieces being in sliding contact with one of said first and second pattern electrodes; and input means comprising a first resistor which has one end connected to said first conductive contact piece and the other end connected to an A/D conversion input terminal and a second resistor which has one end connected to said second conductive contact piece and the other end connected to the other end of said first resistor and which has a different resistance from that of said first resistor, for inputting a voltage to said A/D conversion input terminal which voltage is variable in response to a change in sliding contact position of said first and second conductive contact pieces with reference to said pattern conductor; and a contact piece for applying a reference voltage Vref and a resistor connected between said contact piece and the reference voltage terminal.

9. An encoder device comprising:

a pattern conductor composed of at least two rows, each row having an array comprised of a first conductor zone to which a first electric potential is applied and a second conductor zone to which a second electric potential is applied, said first and second zones being spaced from one another and the arrays being different from one another;

input means formed by connecting a pair of resistors having different values from each other, first ends of the pair of resistors being connected to respective conductive contact pieces each slidingly engaging one of said contact zones and second ends thereof being connected to each other to generate more than two voltage levels at said second ends, the voltage level present at said second ends being determined by the position of the contact pieces relative to the pattern conductor; and an A/D converter connected to said input means for converting an analog potential fed by said input means into a digital form to represent the voltage level applied to the A/D converter.

10. An encoder device according to claim 9 in which said pattern conductor, input means and A/D converter are provided in a plurality of sets.

11. An encoder device according to claim 10 in which said pattern conductor is provided on a zoom ring of a zoom lens and said input means is provided on a stationary member of the zoom lens.

12. An encoder comprising:

a pattern conductor including first pattern electrodes to which a first potential is applied and second pattern electrodes to which a second potential is applied;

first and second arrays each including selected ones of said first and second pattern electrodes;

a first contact piece connected to one end of a first resistor and a second contact piece connected to one end of a second resistor whose resistance value is different from that of said first resistor;

said first and second contact pieces each slidably engaging one of said first and second arrays;

means for changing sliding contact positions of said first and second contact pieces relative to said pattern conductor; and an A/D converter connected to the junction point between the other ends of said first and second resistors.

13. An encoder device according to claim 12 in which said pattern conductor further includes a non-electrode zone which is deviod of said first and second pattern electrodes; and a pull-up resister connected between said junction point and a third potential terminal.

14. An encoder device according to claim 12 in which said A/D converter discriminates four different kinds of potentials which are produced by means of said first and second resistors and said first and second pattern electrodes.

15. A zoom encoder for a zoom lens comprising:

a pattern conductor including a first pattern electrode to which a first potential is applied and a second pattern electrode to which a second potential is applied;

contact piece means including a first contact piece connected to one end of a first resistor and a second contact piece connected to one end of a second resistor whose resistance value is different from that of said first resistor;

means for changing a focal length of said zoom lens, by changing the relative position between said pattern conductor and said contact piece means which is in sliding contact with said pattern conductor; and an A/D converter connected to the junction point between the other ends of said first and second resistors for discriminating four differnt kinds of potentials which are produced at said junction point by combinations of said first and second potentials and said first and second contact pieces.

16. A zoom encoder according to claim 15 in which said conductor pattern further includes a non-electrode portion having a width larger than that of the contact area between said first and second pattern bodies and outputs of said first and second contact pieces.

17. A zoom encoder according to claim 16 in which a pull-up reistor is provided between said junction point and a third potential terminal.

18. A zoom encoder according to claim 15 in which said pattern conductor is provided on a zoom ring and said contact piece means is provided on a stationary member.

19. A zoom encoder according to claim 18 in which said pattern conductor is supplied with first and second potentials by third and fourth patterns.

20. An encoder device comprising:

pattern conductors in at least two rows, each row being formed by alternately combining a first conductor zone to which a first potential is applied and a second conductor zone to which a second potential is applied;

two contact pieces which are respectively in selective sliding contact with the pattern conductors in each row and are in sliding contact with said respective rows of said pattern conductors, contact positions therebetween varying in relation to the latter;

a first resistor whose one end is connected to one of said contact pieces and a second resistor whose one end is connected to the other of said contact pieces and whose resistance value is different from that of said first resistor; and an A/D converter connected to the junction point between the other ends of said first and second resistors which converter is capable of discriminating four different levels of potentials at said junction point on the single terminal thereof.

21. An encoder device comprising:
pattern conductors in a plurality of rows, each row being formed by combining a plurality of conductor zones having different potentials from one another;
a plurality of contact pieces which are in sliding contact with said respective rows of said pattern conductors, contact positions therebetween varying in relation to the latter;
a plurality of resistors connected to said respective contact pieces each resistor having a different resistance value; and
an A/D converter connected to the junction point between said resistors which converter is capable of discriminating potentials at the junction point.

22. An encoder device comprising:
a movable member;
encoding means arranged on said movable member comprising a plurality of rows of predetermined patterns;
a plurality of sensing means having an output terminal, each sensing means for sensing one of said rows of patterns;
said sensing means and said encoding means being movable relative to one another whereby the portion of the patterns sensed by said sensing means causes the generation at said output terminal of a predetermined output whose output level represents the position of the encoding means relative to said sensing means;
each row being capable of applying more than two different signal levels to its associated contact piece, the level applied being determined by the position of the encoding means relative to the sensing means; and
means coupled to said sensing means for combining selected ones of said sensing means outputs into a second code format wherein the number of code elements in said second code is less than the total number of sensing means and wherein the number of values of each code element in said code format is greater than the number of output levels capable of being generated at the output of said sensing means.

23. The encoder device of claim 22 wherein said rows of patterns are arranged about the periphery of a substantially cylindrical-shaped member rotatable about its longitudinal axis, said sensing means generating a code representative of the angle through which said cylindrical-shaped member is rotated.

24. The encoder device of claim 22 wherein each of said rows comprises a predetermined arrangement of pattern members of varying lengths measured in the direction of movement wherein said patterns are each maintained at either a first or second predetermined potential level.

25. The encoder device of claim 24 further comprising non-electrode zones selectively arranged between patterns coupled to said first and second potential levels; said zones being isolated from said first and second potential levels.

26. The encoder device of claim 22 wherein said means for converting the outputs of said sensing means into a second code comprise a plurality of pairs of resistance elements, each resistance element of a pair having a first end thereof connected in common and a second end therof connected to an associated one of said sensing means, said second code means being generated at said common terminals of said resistance element pairs; and
the resistance values of the resistance elements in each pair being different.

27. The encoder device of claim 26 wherein said resistance values differ in accordance with the ratio 1:1.67.

28. The encoder device of claim 22 wherein said means coupled to said sensing means for converting comprises means for converting each code element of the first code to a code element in the second code format which has a greater number of levels than the associated code elements of the first code.

29. The encoder device of claim 28 further comprising means for converting the code elements of the second code format into a third code format different from said second code format.

30. The encoder device of claim 29 wherein said means for converting the code elements of the second code format comprises an analog-to-digital converter.

31. An encoder device comprising:
pattern conductors in a pair of rows formed by combining a plurality of conductor zones having different potentials from each other;
a pair of contact pieces which are in sliding contact with said respective rows of said pattern conductors, contact positions therebetween varying in relation to the latter;
a pair of resistors having first ends connected to said respective contact pieces and second ends connected in common for selectively generating one of four different potential levels being produced at the junction point of said resistors according to the position of the contact pieces relative to the pattern conductors; and
an A/D converter connected to the junction point between said resistors which converter is capable of discriminating said four levels of potentials at the junction point.

32. An encoder device comprising:
first and second movable members which are movable relative to one another;
said first movable member having pattern members comprising a plurality of rows, the pattern members in each row having electrode portions made of electrically conductive members and non-electrode portions made of electrically non-conductive members;
potential supplying means for supplying different potentials to each row of the pattern members;
a plurality of contact piece members disposed on said second movable member, which are selectively in contact with the electrode and non-electrode portions of the pattern members on each row;
voltage output means coupled to a plurality of the contact piece members providing an output voltage which is at one of more than three levels depending on which electrode or non-electrode portion, the contact piece member for each row is in contact with, said voltage output means changing the output voltage depending upon which row contacting with the electrode portion and non-electrode portions; and
analog/digital converter means for converting the output potentials into a digital output, said analog/- digital converter means having such a precision that it can discriminate the change in potential.

33. The encoder device of claim 1 wherein said first and second arrays of pattern electrodes are arranged upon a substrate in such a manner as to enable the first and second contact pieces: to simultaneously engage an associated pattern electrode in each of their arrays; to be simultaneously displaced from a pattern electrode; to have one of said conductive pieces engage a pattern electrode while the other engages said substrate, said conditions being determined by the position of said first and second contact pieces relative to said first and second arrays to thereby selectively establish one of four different voltage levels at the input to said A/D conversion input terminal.

34. The encoder device of claim 1 wherein said plurality of voltage levels is four in number.

* * * * *

UNITED STATES PATENT AND TRADEMARK OFFICE
CERTIFICATE OF CORRECTION

PATENT NO. :    4,949,087

DATED      :    August 14, 1990

INVENTOR(S) :   Azuma Miyazawa

It is certified that error appears in the above-identified patent and that said Letters Patent is hereby corrected as shown below:

Column 1, line 42, "shown" should be --show--

Column 10, line 20, "differnt" should be --different--

Column 10, line 45, delete the "," after "peripheral"

Column 12, line 7, "resister" should be --resistor--

Column 12, line 42, "reistor" should be --resistor--

Column 14, line 2, "therof" should be --thereof--

Signed and Sealed this

Fourteenth Day of January, 1992

Attest:

HARRY F. MANBECK, JR.

*Attesting Officer*    *Commissioner of Patents and Trademarks*